US006270861B1

(12) United States Patent
Mashburn

(10) Patent No.: US 6,270,861 B1
(45) Date of Patent: Aug. 7, 2001

(54) INDIVIDUALLY CONTROLLED ENVIRONMENTS FOR PULSED ADDITION AND CRYSTALLIZATION

(75) Inventor: Douglas N. Mashburn, Knoxville, TN (US)

(73) Assignee: UT, Battelle LLC, Oak Ridge, TN (US)

(*) Notice: Subject to any disclaimer, the term of this patent is extended or adjusted under 35 U.S.C. 154(b) by 0 days.

(21) Appl. No.: 08/472,833

(22) Filed: Jun. 7, 1995

Related U.S. Application Data

(62) Division of application No. 08/278,212, filed on Jul. 21, 1994, now abandoned.

(51) Int. Cl.$^7$ ............................ C23C 14/28; C23C 14/50; C23C 16/46; C23C 16/48

(52) U.S. Cl. ........................ 427/561; 427/596; 118/719; 118/730; 118/733; 118/725

(58) Field of Search ..................................... 427/561, 566, 427/595, 596, 597; 118/727, 726, 729, 730, 733, 50.1, 641, 719, 724, 725, 665, 666, 698, 692, 708, 712

(56) References Cited

U.S. PATENT DOCUMENTS

| | | | |
|---|---|---|---|
| 3,227,132 | * | 1/1966 | Clough et al. .................... 118/733 |
| 4,430,149 | * | 2/1984 | Berkman ........................... 118/733 |
| 4,508,049 | * | 4/1985 | Behn et al. ....................... 427/488 |
| 4,866,032 | * | 9/1989 | Fujimori et al. .............. 204/192.11 |
| 4,949,669 | * | 8/1990 | Ishii et al. ....................... 118/733 |
| 4,966,887 | * | 10/1990 | Garvey ............................. 427/561 |
| 5,015,492 | * | 5/1991 | Venkatesan et al. ............. 427/561 |
| 5,085,166 | * | 2/1992 | Oka et al. ........................ 118/727 |
| 5,145,713 | * | 9/1992 | Venkatesan et al. ............. 427/561 |
| 5,207,884 | * | 5/1993 | Char et al. ....................... 118/727 |
| 5,242,706 | * | 9/1993 | Cotell et al. ..................... 429/596 |
| 5,254,832 | * | 10/1993 | Gartner et al. ................... 427/561 |
| 5,258,366 | * | 11/1993 | Nagaishi et al. ................. 427/596 |
| 5,308,461 | * | 5/1994 | Ahonen ........................ 204/192.11 |
| 5,316,585 | * | 5/1994 | Okamoto et al. ................. 118/726 |

OTHER PUBLICATIONS

Miura et al, "Structure & Superconducting Properties of YBaCuO Films Prepared by Transversely Excited Atmospheric Pressure $CO_2$ Pulsed Laser Evaporation," *Appl. Phys. Lett.* 52(12) Mar. 1988, p1008–10.*

Sankur et al. "Formation of Dielectric & Semiconductor Thin Films by Laser–Assisted Evaporation," 1988—(No month available), p. 271–284 Journal Source Unknown.*

Marquardt et al, "Deposition of Laser Produced Carbon Films from Laser Produced Plasmas," *Mat. Res. Symp. Proc.*, vol. 30, 1985 (No month) p. 325–330.*

Preparation and Characterization of Pulsed Laser Deposited HTSC Films by L. Schultz et al., SPIE vol. 1187 Processing of Films for High $T_c$ Superconducting Electronics (1989) No month.

(List continued on next page.)

*Primary Examiner*—Marianne Padgett
(74) *Attorney, Agent, or Firm*—Joseph A. Marasco; George L. Craig

(57) ABSTRACT

An apparatus for forming thin films includes a deposition chamber having a window and having an environment maintained at a temperature and pressure selected for optimized deposition conditions. A target is supported within the deposition chamber, and a laser source projects a laser beam through the window onto the target with sufficient energy and duration to produce an ablation plume. A crystallization chamber is in communication with the deposition chamber through an opening and has an environment maintained at a temperature and pressure selected for optimized crystallization conditions. A substrate is movably supported within the crystallization chamber in front of the opening in alignment with the ablation plume. A seal or other suitable means segregates the environments of the deposition chamber and the crystallization chamber.

7 Claims, 2 Drawing Sheets

OTHER PUBLICATIONS

Superconducting Bi–Sr–Ca–Cu–O Films Prepared By Laser Ablation by A. Gupta et al., SPIE vol. 1187 Processing of Films for High $T_c$ Superconducting Electronics (1989) No month.

Layered Growth of HTSC Thin Films Using Pulsed Laser Deposition by Tomoji Kawai et al., SPIE vol. 1187 Processing of Films for High $T_c$ Superconducting Electronics (1989) No month.

Substrates for HTS Films by Randy W. Simon, TWR Space & Technology Group, SPIE vol. 1187 Processing of Films for High $T_c$ Superducting Electonics (1989) No month.

In–situ growth of superconducting $YBa_2Cu_3O_y$ films by pulsed laser deposition by J.B. Boyce et al., SPIE vol. 1187 Processing of Films for High $T_c$ Superconducting Electronics (1989) No month.

Physics on In–Situ Laser Deposition of Superconducting Thin Films by H. S. Kwok et al., SPIE vol. 1187 Processing Films for High $T_c$ Superconducting Electronics (1989) No month.

* cited by examiner

INDIVIDUALLY CONTROLLED ENVIRONMENTS FOR PULSED ADDITION AND CRYSTALLIZATION

This is a divisional of application Ser. No. 08/278,212 filed Jul. 21, 1994 now abandon.

FIELD OF THE INVENTION

The present invention relates generally to methods and apparatuses for preparing thin films and, more specifically, to a method and apparatus which separates the deposition or material addition environment from the film crystallization or growth environment, thereby allowing each to be optimized individually. The film resides mostly in the second environment, being very briefly but repeatedly exposed to the first for new material deposition. Pulsed laser ablation is used to provide the very short intense pulses of material which makes such a process feasible.

BACKGROUND OF THE INVENTION

Preparation of thin crystalline films of compound materials has proven difficult where one or more of the component elements are too volatile at the crystal growth temperature to maintain stoichiometry in the film. Examples of materials where this problem exists include high temperature oxide superconductors such as $Y1Ba2Cu3ox$, $Tl2Ba2Ca2Cu3Ox$, and variants, other multi-element metal oxides, and compound semiconductors such as GaAs, GaAlAs, GaInAs, and HgCdTe.

Many of the deposition processes, which give excellent crystalline films of single elements or compounds of elements with similar volatilities have difficulty with compound materials whose elements differ widely in volatility. Most of these processes work best at vacuum or near-vacuum pressure. These processes include low pressure chemical vapor deposition (LPCVD), sputtering, E-beam evaporation, molecular beam epitaxy, pulsed laser ablation, and pulsed electron beam ablation.

Several of these conventional processes require an anneal step to be performed at much higher pressure of the volatile element in order to restore the stoichiometry. This procedure is less and less effective as the film thickness is increased.

Other problems inherent in this field include film surface temperature determination and control, problems of handling and risk of contamination of substrates and films due to thermal pastes, and vacuum system contamination and personnel exposure to toxic chemicals. Moreover, a continuing need exists for improved sample throughput and automation, and for the elimination of ablation target overheating and ablation particle contamination of deposited films.

The use of excimer lasers in the deposition of YBCO thin films is described in "Physics of In-Situ Laser Deposition of Superconducting Thin Films" by H. S. Kwok et al., *SPIE* Vol. 1187, p. 161 (1989). This article notes the significance of target interaction conditions and the properties of the laser-generated plume to the formation of high quality films.

Another excimer laser deposition technique is described in "In-Situ Growth of Superconducting $YBa_2Cu_3O_y$ Films By Pulsed Laser Deposition" by J. B. Boyce et al., *SPIE* Vol. 1187, p. 136 (1989). Here, the authors noted that diminished transport properties correlate with the imperfect alignment and epitaxy of the YBCO and substrate. Experiments were conducted using a ten-sided polygon target holder and a laser pulse frequency of 1 to 10 Hz.

Further laser ablation techniques are described in "Superconducting Bi—Sr—Ca—Cu—O Films Prepared by Laser Ablation" by A. Gupta et al., *SPIE* Vol. 1187, p. 130 (1989), and "Preparation and Characterization of Pulsed Laser Deposited HTSC Films" by L. Schultz et al., *SPIE* Vol. 1187, p. 204 (1989).

SUMMARY OF THE INVENTION

An object of the present invention is to provide an apparatus and method for preparing thin films in which the deposition or material addition environment is separated from the film crystallization or growth environment, whereby the parameters for said material addition and growth can be optimized individually.

Another object of the present invention is to provide an apparatus and method for preparing thin films capable of achieving film surface temperature determination and control.

Another object of the present invention is to provide an apparatus and method for preparing thin crystalline films of compound materials where one or more of the component elements are too volatile at the crystal growth temperature to maintain stoichiometry in the film, while allowing proper pressure for the deposition process.

A further object of the present invention is to provide an apparatus and method which provides film temperature control while preparing thin crystalline films, thereby eliminating the need for thermal paste in substrate mounting, and reducing the need for handling and risk of contamination of substrates and films.

These and other objects are achieved by providing an apparatus for forming thin films which includes first means for containing a target material, second means, in communication with the first means, for containing a substrate, and third means for maintaining a pressure differential between the first and second means.

Other objects, advantages and salient features of the invention will become apparent from the following detailed description, which, taken in conjunction with the annexed drawings, discloses preferred but non-limiting embodiments of the invention.

DETAILED DESCRIPTION OF THE INVENTION

Figure 1:
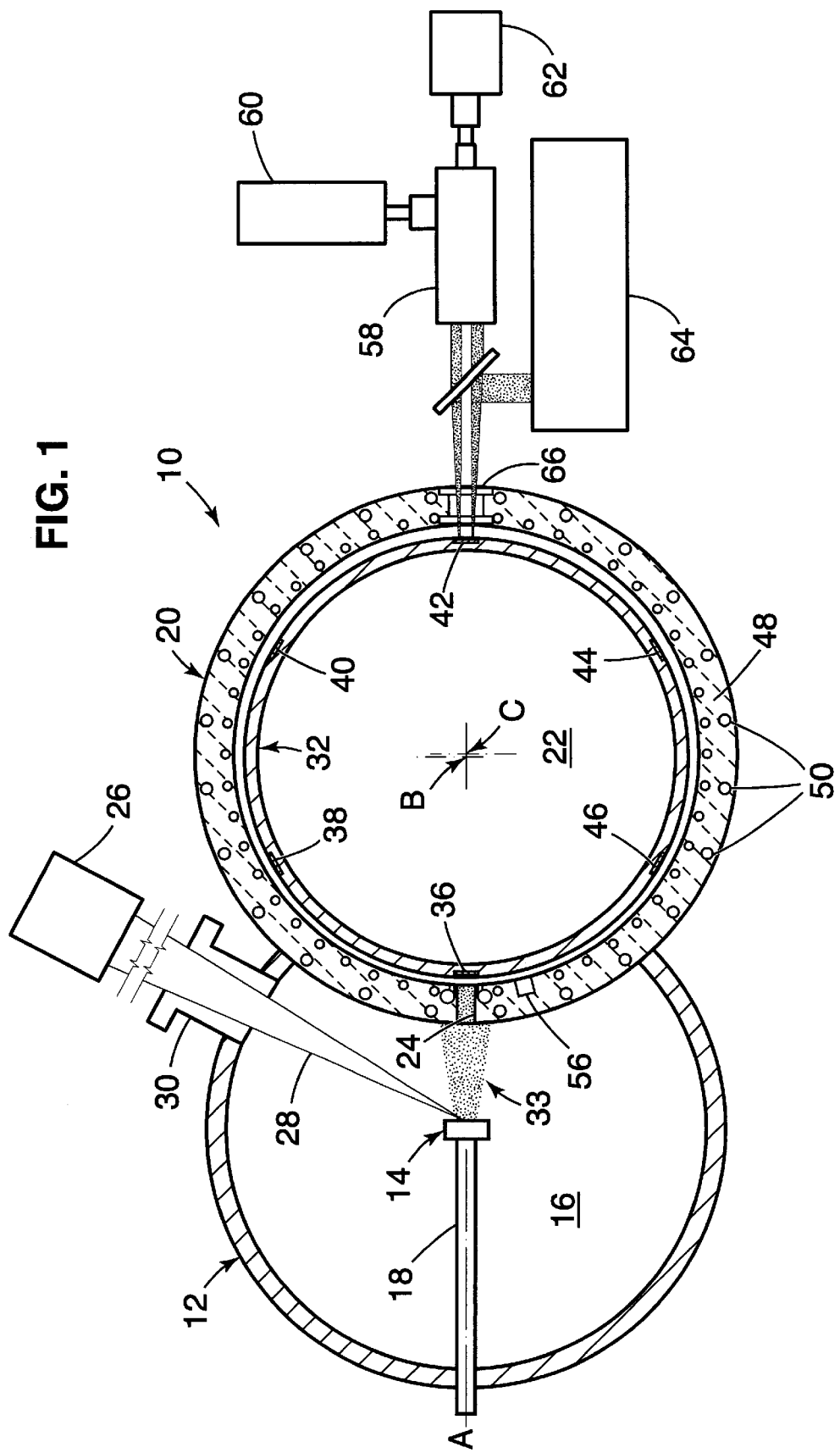
FIG. 1 is a schematic view, partially in horizontal cross-section, of a preferred embodiment of the present invention.
Figure 2:
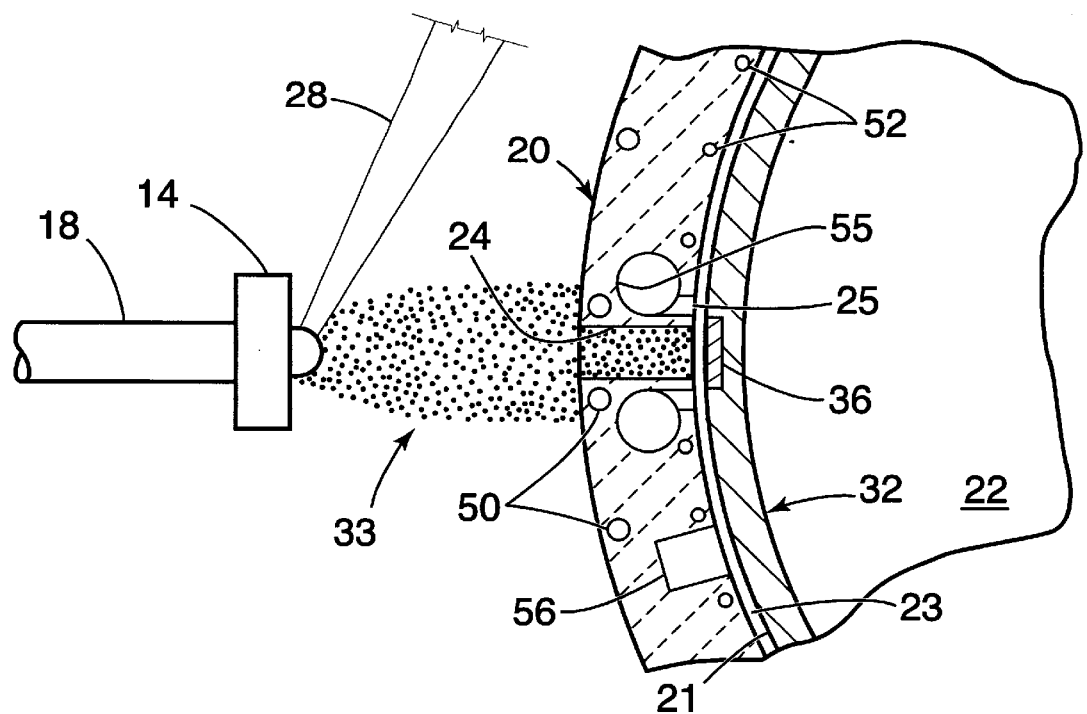
FIG. 2 is an enlarged, horizontal cross-sectional view showing an area between the first and second chambers of FIG. 1.

Referring to FIGS. 1 and 2, an apparatus 10 for making thin films includes first means 12 for containing a target material 14. The first means 12 can be any suitable pressure vessel which defines a deposition chamber 16. A support 18 extends into the chamber 16 to hold the target material 14. The support 18 may be caused to rotate about its axis "A" by a drive mechanism (not shown).

Second means 20, in communication with the first means 12, contains one or more substrates. The second means 20 can be any suitable pressure vessel which defines a crystallization chamber 22. Chambers 16 and 22 are in communication with each other through an opening 24.

As will be more fully explained below, the provision of separate deposition and crystallization chambers permits the separation of the material addition or deposition environment from the film crystallization or growth environment, with advantages that will be understood from the following explanation.

A laser source 26 outputs a laser beam 28 which is incident on the surface of the target 14. The beam 28 is focused onto the target 14 through an optical window 30. Focusing optics can be incorporated into the source 26 or integrated into the window 30, or can be separate elements.

The source is preferably a laser that achieves extremely high instantaneous deposition rates through very short pulses. One type of suitable laser source is an excimer laser, such as a 248 nm (25 ns FWHM) KrF excimer laser, which is commercially available as the LUMONICS model 861T.

When ablation occurs, an ablation plume 33 is formed in the deposition chamber 16. The support 18 positions the target 14 within the deposition chamber 16 at a location calculated to align the ablation plume 33 with the opening 24 which provides communication between the two chambers.

Chamber 22 houses a cylindrical rotor 32 which can be rotated about its axis "B" to 6,000 rpm by a drive mechanism (not shown). A plurality of substrates 36, 38, 40, 42, 44, and 46 are mounted in the cylindrical outer surface of the rotor 32 at equi-distantly spaced intervals (for the illustrated embodiment using six substrates, the spacing is at 60° intervals). In one particularly preferred embodiment, the rotor 32 has a diameter of 150 mm. The surfaces of the substrates upon which a deposit will be made thus face the inner cylindrical surface of the chamber 22.

A layer of heat insulating material 48 is disposed between the inner and outer surfaces of the vessel 20. Resistive heating wire 52 is disposed in thermal contact with the outer surface of the inner wall 23 of the vessel 20. Selective and controlled energization of the heating wires 52 controls the crystallization temperatures within the chamber 22. A coolant is circulated through lines 50 disposed in thermal contact with the outer wall of the vessel 20. Internal pressure within the chamber 22 is also regulated for optimum crystallization conditions using appropriate gases, such as thallium vapor and oxygen.

Pressure and temperature within the deposition chamber 16 are separately controlled and optimized, with optimum gas composition. The opening 24 permits deposition to occur without blending the two separate atmospheres. In the embodiment of a 150 mm rotor, the opening is rectangular, with a 5 mm height and 10 mm width.

In order to maintain the pressure differential, a differentially pumped gas dynamic seal 54 is provided in the vicinity of the opening 24. The seal 54 is between the outer cylindrical surface 21 of the rotor 32 and the inner cylindrical surface 23 of the vessel 20 in the region around the opening 24. The seal includes differential pumping ports 55 disposed in proximity to the opening 24. This seal 54 limits leakage between the two chambers allowing different gases in each at substantially different pressures.

The seal 54 functions to maintain a pressure differential between the two chambers 16 and 22. This is accomplished by placing the outer surface 21 of the rotor 32 in close proximity to the inner surface 23 of the vessel 20. This close proximity creates a restriction which limits the amount of flow capable of occurring between the two chambers. The close proximity only has to occur at the opening 24, and in fact, a greater clearance between the surfaces 21 and 23 in areas away from the seal zone is desirable so that gas can wash over the film surface as the sample makes the remainder of its orbit (during rotation of the rotor 32). The additional clearance can be achieved by eccentric mounting of the rotor 32 within the vessel 20, meaning that the rotation axis "B" of the rotor 32 is slightly to the left (in FIG. 1) of the center "C" of the vessel 22.

Depending on the materials being used and compatibility of the gases used as atmosphere, and the gases used as atmosphere in each chamber, the restriction alone may provide a sufficient "seal" for maintaining a pressure differential between the two chambers 16 and 22, given that the chamber 16 is maintained at a lower pressure than the chamber 22 by a vacuum pump (not shown) with sufficient flow rate.

If additional sealing is needed, an annular groove 25 is provided around the opening 24 between the two chambers 16 and 22. This groove 25 is coupled through ports 55 to a vacuum pump (not shown). The vacuum imparted by the pump to the ports 55 draws off escaping gas from chamber 22 preventing it from passing into the chamber 16. Other gas pumping means could be employed, such as a non-contaminating recirculator pump which would return the diverted gas back to the chamber 22. In the case of a condensable gas, condensation must be avoided by using a hot pumping system or by deliberate condensation before the pump in which case the lost material must be replaced in the vapor supplied to the chamber 22.

During deposition, the rotor 32 is caused to rotate at, for example, 100 rev/sec or 6000 rpm, so that the substrates are moved at high speed (about 50 m/sec). Once each revolution of the rotor 32 the substrates are whisked by the opening 24 that couples the crystallization chamber 22 to the deposition chamber 16. At the instant when the substrate is in front of the opening 24, the deposition pulse is synchronized to arrive through the opening 24 and add a layer of material to the substrate. In the case of laser ablation, this pulse of material arrives within 10 to 20 microseconds, while the film/substrate takes almost 100 microseconds to pass the opening 24 and then 10,000 microseconds to complete a revolution. Thus, the passage time of the film/substrate across the opening is adequately long for deposition, yet too brief to allow a significant amount of the volatile elements in the film layers below the surface to escape.

Accordingly, the substrate resides 99% of the time in the temperature-pressure-gas composition environment of the crystallization chamber, and only 1% out of it. Current laser ablation experience gives somewhat less than one monatomic layer of material per pulse so that thousands of pulses are required to grow films of a few hundred nanometers in thickness. This gives ample opportunity to add to each new film layer the volatile elements such as thallium and oxygen entirely from their vapors in the crystallization chamber 22, and to do so evenly throughout the entire film thickness, completely obviating the need for any post-deposition diffusion/annealing step.

The ratio of volatile elements in the film can be changed by adjusting the partial pressures of those elements in the crystallization chamber 22. Dilution by an inert gas buffer can be used to lower the partial pressure at a given total pressure in cases where the vapor pressure of the element is actually too high at the temperature for optimum crystal formation.

Non-contact in-situ film diagnostics can be easily incorporated into the apparatus 10 for monitoring during film growth. An optical viewing port 66 permits use of both a Raman probe 64 and a microscope 58. Electrical conductivity can be measured by an inductive pickup coil 56. The optical microscope 58 provides real-time viewing of the growing film's microstructure. This can be facilitated by use of a pulsed light source 60 and a video camera 62. The Raman spectroscopy probe 64 gives on-line composition and crystal orientation information as the film is being deposited/grown. Both can also be used to track annealing changes after deposition has ceased, or to follow changes during cool-down.

Figure 3:
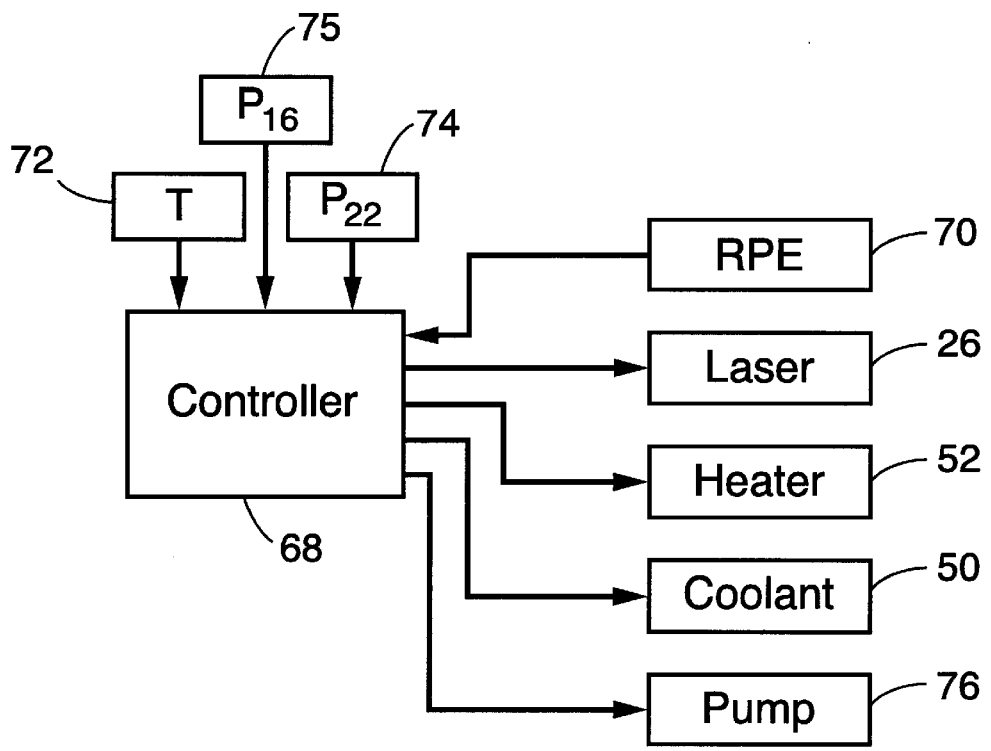
FIG. 3 is a block diagram of the control system used in the apparatus of FIG. 1.

Operation of the apparatus 10 can be facilitated using a controller 68, shown in FIG. 3. Synchronization of laser firing and substrate positioning next to the opening 24 can be achieved using an optical pickup associated with a rotor position encoder 70. The pickup outputs a signal to the controller 68 which then synchronizes firing of the laser source 26, so that a laser ablation plume will arrive only when a substrate is positioned in front of the opening 24. Conventional optical pickups and a slotted disk mounted on the external shaft of the rotor can provide this function easily.

The controller 68 can also control the internal environments of the two chambers 16 and 22 by receiving temperature and pressure signals from a temperature sensor (T) 72 and pressure sensors (P) 74, 75. The heater elements 52 are kept out of the thallium vapor within chamber 22 by being placed on the opposite side of the pressure wall 23. The controller 68 can provide a control signal to a vacuum pump 76 which exhausts the gas dynamic seal 54. Other pumps, valves, and pressure sensors may be employed to monitor and control the pressure within each of the chambers.

Heating rates are preferably kept low to make sure of equilibration. The temperature sensor 72 could be, for example, a thermocouple located in thermal contact with the inner surface 23 of the chamber 20. The controller 68 provides a control signal to power the heater elements 52 in a manner calculated to maintain a predetermined, optimum crystallization temperature inside the chamber 22. The heating, insulation and outer jacket cooling uses conventional vacuum oven technology.

According to the present invention, the substrate-film surface temperature is readily controlled. The entire wall of the crystallization chamber will be uniformly heated and the rotor will be allowed to equilibrate to this thermal environment, so the film-substrate will be immersed in a uniform temperature zone 99% of the time. During the passage across the ablation opening 24, the film will see a different thermal environment, essentially room temperature until the ablation begins, followed by, for a few microseconds, very high temperatures. The present invention roughly balances the blackbody radiation loss by the sample with plume radiant and impact energy addition. Once the film is whisked back into the high pressure high temperature zone, the combination of radiation and forced convection of the hot gas will quickly reestablish the surface temperature very close to that of the chamber wall.

Timing considerations alone assure that the worst case film surface temperature uncertainty will be less than 1%. Therefore, by simply monitoring the oven wall with conventional thermocouples, the film surface temperature can be determined much more accurately than can be done in conventional deposition schemes.

Using a double walled chamber with the inner wall heated and the outer wall cooled provides two additional benefits. Maintaining the outer wall temperature constant helps regulate the temperature of the inner wall by giving a constant heat loss. Secondly, keeping the outer wall cool prevents undesirable heating of the ablation targets 14, chamber 16, windows 30 and associated seals. Overheating of the target is suspected by some of increasing the production of particles by the ablation process. Particles are generally detrimental to high quality films.

The present invention also has an intrinsic rejection of particles because of the high speed motion of the film past the ablation opening. While the plume vapor has very high velocity (up to 10 km/sec) the particles travel much slower. With a target to substrate distance of 5 cm, and a substrate velocity of 50 m/sec particles with a velocity less than 500 m/sec will completely miss the film. Increasing the rotor speed will reject proportionally faster particles.

The present invention also alleviates concern over thermal contact of the substrate with the mount. The substrate needs only to be set in a slot securely enough to stay in place as the rotor turns. By standardizing the slots and having all substrates' dimensions standardized to fit, a remote handling mechanism can be used to insert and remove the samples. For our research application, the sample size and shape were chosen to be compatible with existing characterization equipment where possible, and an optimum was 10 mm×5 mm×0.5 mm.

While a single substrate could be installed on the rotor, the use of six substrates simultaneously will further enhance investigation efficiency by allowing quick comparison of different substrates and composition variations at constant thallium-oxygen-temperature conditions. multiple substrates available quickly allows easy checking of process repeatability. When only one substrate is desired to be subjected to film growth, the other slots can be filled with dummy or throwaway samples.

The sample handling mechanism can be operable through a loadlock that maintains the rotor chamber at operating temperature and pressure. Valves for such a loadlock can have gold seals or possibly even frozen thallium seals. Regardless, the seal between the hot zone and the loading chamber can be less than perfect without causing harm as the loading chamber will be purged and pumped through appropriate traps and pumps, not allowing escape of thallium to the atmosphere, or atmospheric contamination of the chamber. Unloading and re-loading of the rotor can be accomplished in about five minutes for all six substrates. Thus, new depositions can continue with minimal interruption. This will require a small staging chamber or capsule where the samples can be heated, cooled, and purged over a longer time.

Standard electric motors are adequate to drive the rotor if the shaft penetrates to the outside of the chamber 22. A two stage shaft seal (not shown) can be used with buffer gas, or oxygen if present, between the inner hot seal and the outer cold one. Alternatively, condensation and reflux of the thallium vapor could be arranged allowing use of a cold seal only. A conventional ferrofluidic seal is adequate for the cold seal in either case. The hot seal will use gas dynamic seal techniques with close fitting shaft disks and stator plates. While the geometry is different, the principle is the same as previously described for chambers separation. Another alternative is to have the entire rotor and drive canned with bearings that use the thallium as lubricant. In this case, the motor armature would be inside and the drive windings kept outside.

As an example, the present invention can be used to deposit a YBCO material. The deposition chamber 16 is kept at room temperature, while the crystallization chamber 22 is kept between 700 to 800° C. The pressure in the deposition chamber 16 is kept at or below 0.2 Torr, while the crystallization chamber is kept at or above 20 Torr. In general, the deposition chamber 16 is kept at a lower temperature and pressure than the crystallization chamber 22. A $Tl_2Ba_2Ca_2Cu_3O_x$ material is projected to need similar temperatures (as mentioned for the YBCO material) and a pressure of about 50 Torr in the crystallization chamber 22.

The rotor 32 is made of a material selected to be compatible with operating conditions for a particular material deposition. These will include the gas composition as well as the maximum temperature, because there could be a corrosion problem that would weaken the rotor, or there could be one that volatilized the rotor. To get high temperature strength and oxygen resistance for growing a YBCO material, the rotor 32 could be made of Rene 41, a material developed for jet engine turbine blades.

The gas selected for use in the crystallization chamber 22 is determined by the film material desired. It would contain whatever elements tend to be lost by the desired film when heated up to the temperature required to get crystallization—usually about 80% of the finished film's melting point. In the case of YBCO, oxygen is lost at >450° C., and the melting point, if it did not decompose first, would be somewhere around 1,000° C., so the crystallization chamber 22 must contain oxygen to balance the loss. In the case of TBCCO, both oxygen and thallium are boiled out of the film at temperatures over 500° C., and it is believed that 750° C. is needed for best crystal growth. Here a mixture of oxygen and thallium vapor would be needed, but since thallium reacts with oxygen, it is possible to introduce thallium oxide directly (it vaporizes at about 550° C.).

The "seal" 54 provides a non-contact method of restricting leakage of gas between the two connected chambers 16 and 22, each of which is filled with either the same gas at different pressures, or different gases at different pressures. For example, oxygen in chamber 22 and argon in chamber 16, or 20 Torr in one and 1 Torr in the other, or a combination of these. In other words, it is accepted that absolute sealing is not to be expected. However, since the moving part and the stationary never contact each other, the speed of the moving part can be high enough to limit exposure of the substrate at the opening 24 (which in one prototype is 5×10 mm) in 100 microseconds.

Virtually thousands of materials can be deposited using the present invention, with pressures and temperatures and gases in the chambers being selected according to the properties of the deposition materials and the desired characteristics of the deposited materials.

The present invention makes possible the preparation of crystalline and artificially structured materials not achievable with conventional deposition techniques, and has wide uses in materials science research programs throughout government and industry. A unique and valuable feature is the addition and retention of volatile elements homogeneously throughout a solid film, thereby eliminating the "diffusion through solid" processing step that is currently necessary for making the yttrium and Thallium high temperature superconductors, HgCdTe, and many other compound crystalline materials.

The elimination of the diffusion step then offers a way to achieve constant stoichiometry throughout the film, places no restrictions on the density or smoothness of the film, and removes restrictions on the thickness of the film. Many micron or even millimeter thick films are possible. The invention should facilitate careful exploration of intrinsic material properties, phase stabilities, and growth habits of existing and proposed film materials. The invention will also remove restrictions on investigation of true substrate compatibilities, as now we can use the lower temperature phases on more reactive substrates, not being forced to raise the temperature above the intrinsic phase formation temperature in order to drive a diffusion process as is currently the case.

The crystallization pressure of volatile material can be maintained 50 to 100 times higher than the deposition pressure using a single stage gas dynamic seal. Higher ratios are possible with multistage seals or seals and valves in combination. Optimum deposition pressure is possible because it is no longer entwined with the crystallization need.

Substrate heating system of the present invention offers advantages over prior art techniques. Since thermal contact of the substrate-to-holder is unimportant, the substrate-to-heater gluing and/or clamping steps employed in most conventional deposition schemes are unnecessary. This pays several dividends. Time in performing the manual operation is eliminated. Drying and baking steps to remove thermal paste solvent, which would otherwise contaminate the film, are eliminated. Also eliminated are risks of contaminating the substrate surface with paste or dust while handling, and the repeated introduction of organic vapors into the vacuum chamber from the paste. With the substrate holding mechanism of the present invention, the substrates can easily be loaded and unloaded with a remote mechanism, through a loadlock, protecting the chamber from atmospheric contamination and personnel from exposure to thallium-containing or other toxic vapor or dust. The loadlock will allow the chamber to remain at high temperature and operating pressure, greatly reducing the turnaround time for sample changing. Furthermore, multiple samples can be loaded onto the rotor, and then selected for processing electronically without even stopping rotation. The loadlock will couple to one or more static chambers where samples can be heated, cooled, or stored in a nondegrading environment without delaying the deposition activity. This secondary chamber could serve as a film diagnostic point, allowing a Raman probe or microscope to watch the film through cool-down.

The illustrated embodiment employs a rotating rotor carrying samples or substrates being deposited. However, other ways of rapidly changing the environment that the sample is exposed to can be employed. These include fast shuttering or valving with the sample stationary, moving the sample by different means such as a spring arm, tape, or even dropping or shooting it past the opening. The important point is that immersion in the crystallization environment should be the dominant time compared to the time exposed to the deposition environment. In fact, a small gate-type valve in the opening coupling the two chambers will allow even wider variation of deposition rates vs. crystallization times to be achieved. Here the valve might only be open once every 10 to 100 or more rotor revolutions, and the deposition pulsed only that often. A variation envisioned for shortening the exposure to deposition conditions without speeding up the rotor is to have a very high speed valve synchronized to the sample rotor, with the deposition pulse synchronized to it.

Other variations envisioned include mounting the sample on a disk rather than a drum, and keeping the sample fixed with a cylindrical shell or disk rotor with a hole in it providing the environment switching. In the latter cases, the gas dynamic seal would have to operate to seal both the sample to rotor inside and the rotor outside to the chamber wall.

Other uses for this invention include the preparation of artificially layered materials and superlattices. Moreover, while conceived for preparing thin films, the concept is extendable to any thickness. Millimeter thicknesses prepared with current excimer lasers might take days or weeks to achieve, but future lasers will probably speed this up. Thicknesses greater than a fraction of a millimeter may require taking the film into account when planning clearances, gas dynamic seals, rotor balance, etc.

The invention may also find applicability to the laser diode production industry, where GaAs together with various other elements must be crystallized with high quality. Similarly, it may benefit GaAs technology in general. It may also find application in bubble memory and optical storage technology development, as complex metal oxides have properties of interest here.

While advantageous embodiments have been chosen to illustrate the subject invention, it will be understood by those skilled in the art that various changes and modifications can be made therein without departing from the scope of the invention as defined by the appended claims.

What is claimed is:

1. A method for forming thin films comprising the steps of:
   containing a target material in a first container having an interior environment maintained at a first temperature and pressure;
   containing a substrate in a second container having an interior environment maintained at a second temperature and pressure; and
   periodically exposing the substrate to the environment of the first container while simultaneously exposing the target to a laser beam of sufficient energy to form an ablation plume in the first container that extends into the second chamber to thereby deposit material from the plume onto the substrate.

2. A method according to claim 1, wherein the step of periodically exposing the substrate includes mounting the substrate on a rotor and rotating the rotor.

3. A method according to claim 1, further comprising maintaining a gas dynamic seal between the first and second containers at a location where the substrate is exposed to the ablation plume.

4. A method according to claim 1, further comprising maintaining the pressure and temperature of the second container at a higher level than the pressure and temperature of the first chamber.

5. A method according to claim 1, further comprising maintaining the temperature in the first container at about room temperature while maintaining the temperature in the second container at between 700 and 800° C.

6. A method according to claim 1, further comprising maintaining the pressure in the first container at or below 0.2 Torr while maintaining the pressure in the second container at or above 20 Torr.

7. A method according to claim 1, further comprising containing a plurality of substrates in the second container.

* * * * *